United States Patent
Brown et al.

(10) Patent No.: US 6,388,636 B1
(45) Date of Patent: May 14, 2002

(54) CIRCUIT MODULE

(75) Inventors: Robert Walter Brown, Medina, OH (US); Richard Stephen Pollack, Boulder; Joseph Michael Letkomiller, Thornton, both of CO (US)

(73) Assignee: The Goodyear Tire & Rubber Company, Akron, OH (US)

( * ) Notice: Subject to any disclaimer, the term of this patent is extended or adjusted under 35 U.S.C. 154(b) by 0 days.

(21) Appl. No.: 09/911,977

(22) Filed: Jul. 25, 2001

Related U.S. Application Data

(63) Continuation of application No. 09/513,050, filed on Feb. 24, 2000.

(51) Int. Cl.⁷ .................................. H01Q 1/36
(52) U.S. Cl. ................... 343/866; 343/700 MS
(58) Field of Search .................... 343/895, 700 MS, 343/787, 845, 702, 866; 73/146.5

(56) References Cited

U.S. PATENT DOCUMENTS

| | | | |
|---|---|---|---|
| 4,092,487 A | 5/1978 | Imai ...................... 174/52 PE |
| 4,524,324 A | 6/1985 | Dickinson, III ............. 324/323 |
| 4,628,148 A | 12/1986 | Endou ..................... 174/52 PE |
| 4,724,427 A | 2/1988 | Carroll ....................... 340/572 |
| 4,795,693 A | 1/1989 | Ors et al. ................... 430/312 |
| 4,851,855 A | 7/1989 | Tsukamoto et al. ... 343/700 MS |
| 4,911,217 A | 3/1990 | Dunn et al. ............... 152/152.1 |
| 4,924,237 A | * 5/1990 | Honda et al. ................ 343/702 |
| 5,181,975 A | 1/1993 | Pollack et al. ............ 152/152.1 |
| 5,214,410 A | 5/1993 | Verster ....................... 340/572 |
| 5,218,861 A | 6/1993 | Brown et al. ............... 73/146.5 |
| 5,223,851 A | 6/1993 | Hadden et al. ............. 343/873 |
| 5,250,843 A | 10/1993 | Eichelberger ............... 257/692 |
| 5,313,365 A | 5/1994 | Pennisi et al. .............. 361/760 |
| 5,345,231 A | 9/1994 | Koo et al. ............. 340/870.31 |
| 5,420,757 A | 5/1995 | Eberhardt et al. .......... 361/813 |
| 5,461,545 A | 10/1995 | Leroy et al. ................ 361/765 |
| 5,574,470 A | 11/1996 | de Vall ....................... 343/895 |
| 5,808,587 A | 9/1998 | Shima ........................ 343/895 |
| 5,854,480 A | 12/1998 | Noto .......................... 235/492 |
| 5,870,066 A | 2/1999 | Asakura et al. ............. 343/895 |
| 5,879,502 A | 3/1999 | Gustafson ................... 156/292 |
| 5,894,006 A | 4/1999 | Herbst ........................ 264/132 |
| 5,923,300 A | 7/1999 | Mejia ......................... 343/788 |
| 5,963,181 A | 10/1999 | Abe ............................ 343/895 |
| 6,304,232 B1 | * 10/2001 | Brown et al. ............... 343/895 |

* cited by examiner

*Primary Examiner*—Don Wong
*Assistant Examiner*—James Clinger
(74) *Attorney, Agent, or Firm*—Howard M. Cohn

(57) ABSTRACT

Circuit modules having one, two or three double-sided printed circuit boards (PCBs). Each PCB can have coils formed as spiral traces on both sides thereof. The coils can all be connected together, in series or in parallel, to function as a coil antenna. Alternatively, selected ones of the spiral traces can be connected to function as one winding of a transformer, the other coils functioning as another winding of the transformer and connected to an external antenna. Electronic components can be mounted to a lower one of the PCBs, and in embodiments having two or three PCBs, the PCB overlying the lower PCB has a central opening to accommodate the electronic components. A ferrite rod antenna may be disposed in the opening, aligned parallel to the PCBs, to provide a dual-directional antenna system.

12 Claims, 4 Drawing Sheets

CIRCUIT MODULE

CROSS REFERENCE TO RELATED APPLICATIONS

This application is a continuation of U.S. patent application Ser. No. 09/513,050 entitled CIRCUIT MODULE having a filing date of Feb. 24, 2000.

TECHNICAL FIELD OF THE INVENTION

The invention relates to the interconnection and packaging of electronic components and, more particularly, to a circuit module such as an RF transponder for monitoring a condition within a pneumatic tire.

BACKGROUND OF THE INVENTION

As used herein, the term "circuit module" refers to an interconnection substrate such as a printed circuit board (PCB) having electronic components mounted thereto. A PCB is a multi-layer substrate, having alternate layers of insulating material and conductive material. The conductive material is patterned to have conductive "lines" or "traces" for routing signals (and power) from one location on the PCB to another location on the PCB. Electronic components are interconnected with one another by the conductive traces. Conductive traces may be disposed on both sides (surfaces) of the PCB. Examples of electronic components which may be incorporated in a circuit module include:

(a) "active" electronic components such as integrated circuit (IC) devices, and the like;

(b) "passive" electronic components such as resistors, capacitors, and inductors (including transformers), and the like;

(c) switches, relays and the like; and (d) sensors, transducers and the like.

In some cases, a circuit module is intended to be disposed in a "harsh" environment, and it is desirable to isolate the electronic components of the circuit module from such an environment. An example of such an application for a circuit module is an RF transponder which is disposed within a pneumatic tire of a vehicle. In such applications, it is generally desirable to encapsulate or otherwise package the circuit module to isolate the electronic components from the environment.

As used herein, a "transponder" is an electronic apparatus (device) capable of monitoring a condition such as air pressure within a pneumatic tire, and transmitting information (a signal) indicative of the monitored condition to an external device. The external device can be either an RF (radio frequency) reader/interrogator or, simply an RF receiver. A simple receiver can be used when the transponder is "active", and has its own power source. A reader/interrogator would typically be used when the transponder is "passive" and is powered by an RF signal from the reader/interrogator. In either case, in conjunction with the external device, the transponder forms a component of an overall tire-condition monitoring/warning system.

In order to send and receive RF signals, a transponder must have an antenna. The antenna may either be incorporated into the transponder module itself, or it may be external to the transponder module and electrically connected or coupled to it in a suitable manner.

U.S. Pat. No. 4,724,427 (Carroll; 1988), incorporated in its entirety by reference herein, discloses a transponder device. FIG. 9 of the patent, shows a topographical representation of a transponder chip (100) in an embodiment that includes an antenna coil (104) as part of a monolithic chip (102). As disclosed therein, the coil (104) is etched around the periphery of the monolithic chip also known as the chip substrate (102). In the center of the coil (104) are found a custom logic circuit (106), a programmable memory array (108), and a memory control logic (110). Using the chip topography shown in this figure, a functionally complete transponder may be realized on a single semiconductor chip. (see column 11, lines 7–22; numbers edited)

In a similar manner, U.S. Pat. No. 5,345,231 (September 1994) discloses a contactless inductive data-transmission system. FIG. 7 of this patent shows components of a chip having a substrate (52) which can be photolithographically deposited along with antenna coils (50) which can be in a plane above the semiconductor topography (51) of the chip. (column 7, lines 14–17) In both this patent and the aforementioned U.S. Pat. No. 4,724,427, the antenna coils are disposed around the periphery of the IC chip, surrounding the components and periphery of the IC chip.

U.S. Pat. No. 5,574,470 (de Vall; 1996), incorporated in its entirety by reference herein, discloses a radio frequency identification transponder apparatus and method. A transponder is formed of a very thin flexible dielectric substrate (10) on opposite sides of which are formed first (26) and second (31) series-connected halves of a single antenna coil having ends connected to an integrated circuit die (50) mounted to a die bond site (46) at a corner of the substrate (10). Conductive vias (22,24) extend through the substrate (10) to effect connection between the antenna halves (26, 31), from one side of the substrate to the other side of the substrate. Protective laminates (58,60) on either side of the substrate (10) are bonded to one another around the substrate edges, and also are bonded to one another at interior portions through a slot (20) formed in the substrate (10).

The following patents, all of which are incorporated in their entirety by reference herein, are cited as being of interest: 5,923,300; 5,894,006; 5,879,502; 5,870,066; 5,854,480; 5,461,545; 5,420,757; 5,345,231; 5,313,365; 5,250,843; 5,223,851; 5,218,861; 5,214,410; 5,181,975; 4,911,217; 4,851,855; 4,795,693; 4,724,427; 4,628,148; 4,524,324; and 4,092,487.

SUMMARY OF THE INVENTION

According to the invention, a circuit module comprises a first printed circuit board (PCB) having a first surface and a second surface, electronic components mounted to its first surface, a first long conductive spiral trace on its first surface and a second long conductive spiral trace on its second surface, wherein the second long conductive trace is connected in series with the first long conductive trace to form a coil which is connected to the electronic components.

In a second embodiment, other PCBs are stacked parallel to the first PCB, each having a first surface and a second surface, and each having a long spiral conductive trace on its first surface and/or on its second surface. Still other PCBs having no traces may be stacked between the PCBs having traces in order to separate a long trace of one PCB from a long trace of another PCB. A PCB adjacent to, but not possessing, the electronic components may be in the form of a ring having an opening, wherein the opening forms a cavity for containing the electronic components. The long conductive traces are attached all in series with each other to form a single air core antenna coil, and the circuit module functions as a RF transponder.

In a third embodiment, the long conductive traces can be attached in two separate series to form two windings of a coupling transformer, in which one winding (comprised of one or more traces connected in series) is connected to the electronic components, and the other winding (also comprised of one or more traces connected in series) is connected to an external antenna. The external antenna can be a coil of wire disposed circumferentially (360-degrees) around an inner surface of a pneumatic tire, and the circuit module functions as a RF transponder.

In a variation of the second embodiment, a ferrite antenna comprising a coil of wire wound about a ferrite rod is disposed within the cavity formed by the opening in one of the PCBs. The ferrite antenna is aligned parallel with the PCBs, and thus perpendicular with respect to the axis of the coil formed by the long traces, to provide a dual-polarized antenna system.

In a variation of any of the embodiments, the long spiral conductive traces of some or all of the PCBs can be attached to each other in parallel, to improve performance by way of reduced electrical resistance if the spiral coils are made of very fine pitched traces.

Any of the above embodiments of an RF transponder circuit module can be encapsulated within molding material disposed on all external surfaces of the circuit module. The molding material can be any rubber, ethylene propylene diene monomer (EPDM) rubber, butyl rubber, natural rubber, neoprene and mixtures thereof, a mixture of chlorobutyl rubber and natural rubber, or a mixture of styrene-butadiene rubber (SBR) and natural rubber.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Figure 1:
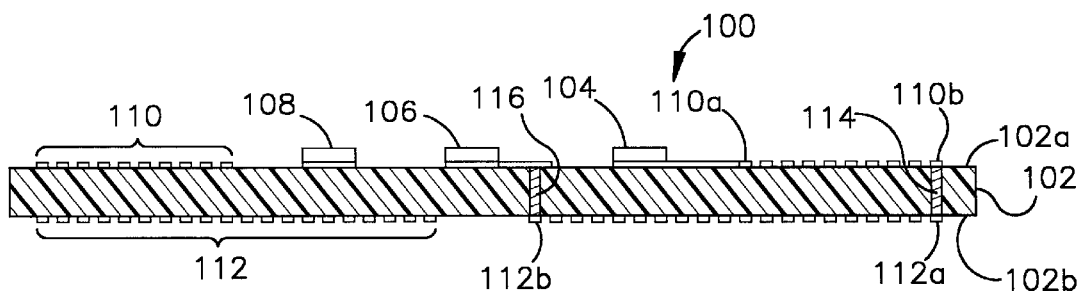
Figure 2:
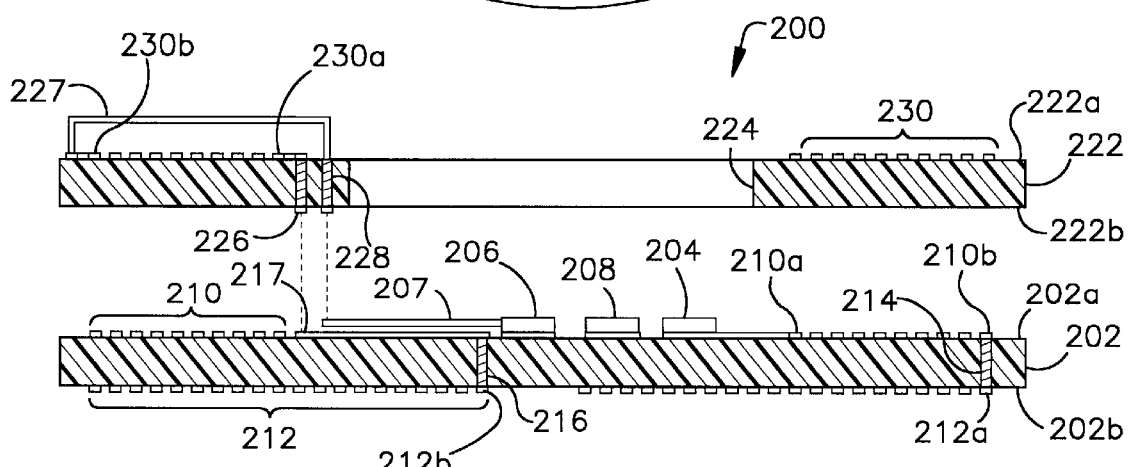

Elements of the figures are typically numbered as follows. The most significant digits (hundreds) of the reference number usually corresponds to the figure number. Elements of FIG. 1 are typically numbered in the range of 100–199. Elements of FIG. 2 are typically numbered in the range of 200–299. Similar elements throughout the drawings may be referred to by similar reference numerals. For example, the element 199 in a figure may be similar, and possibly identical to the element 299 in an other figure. In some cases, similar (including identical) elements may be referred to with similar numbers in a single drawing. For example, each of a plurality of elements 199 may be referred to individually as 199a, 199b, 199c, etc. Such relationships, if any, between similar elements in the same or different figures will become apparent throughout the specification, including, if applicable, in the claims and abstract.

Figure 1A:
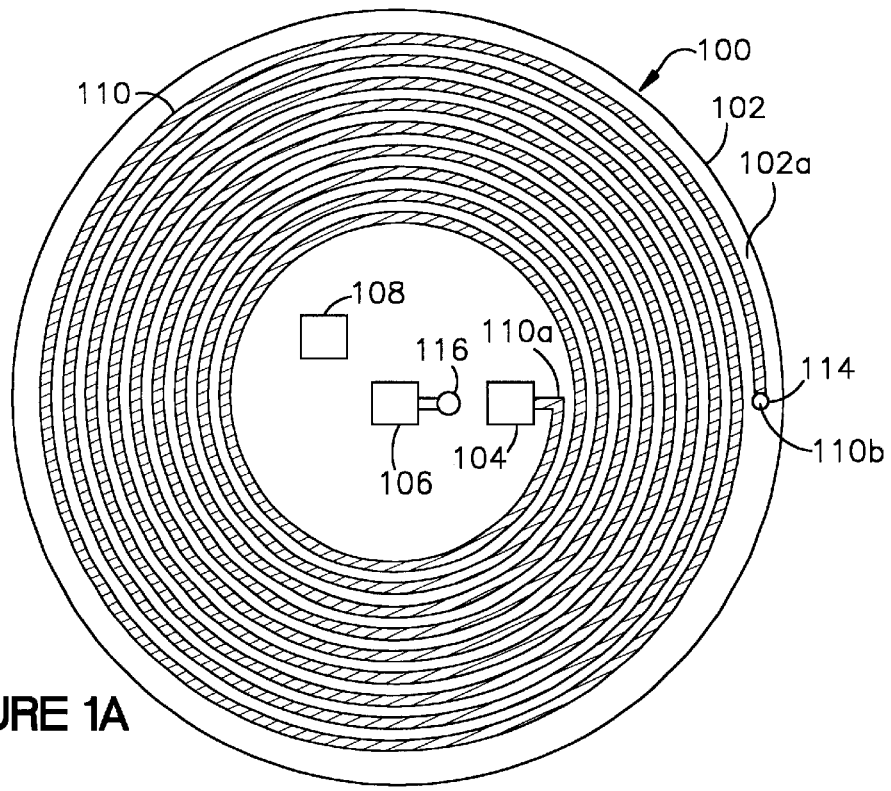
Figure 2A:
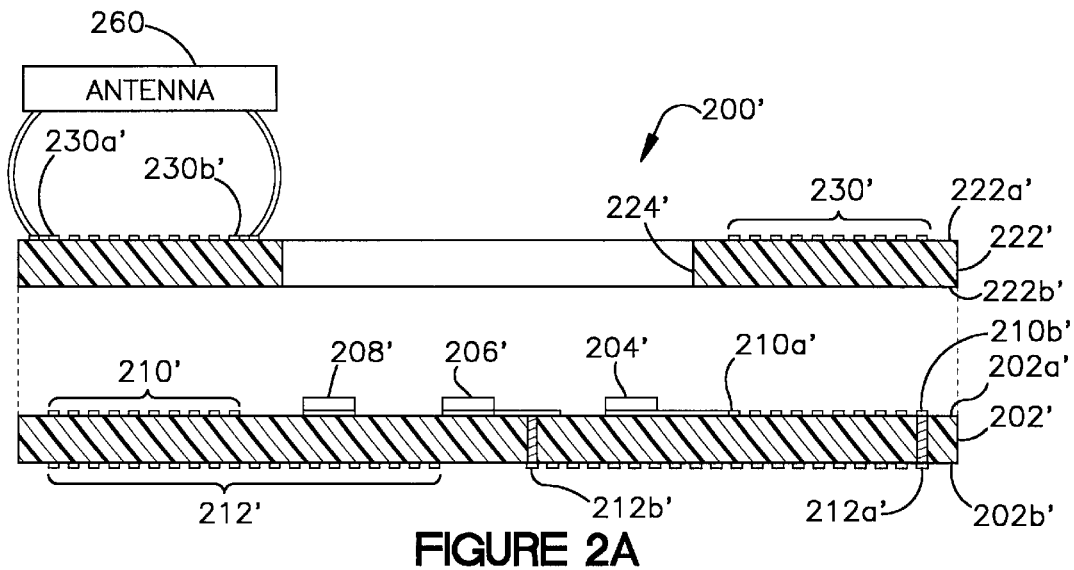
Figure 3:
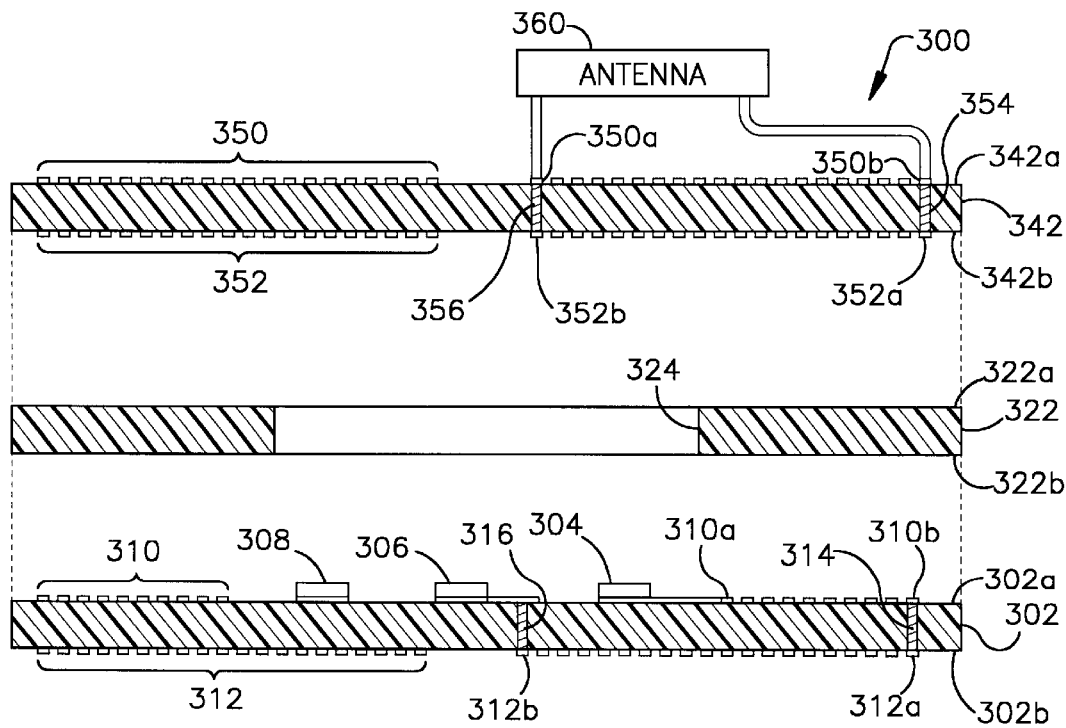
Figure 3A:
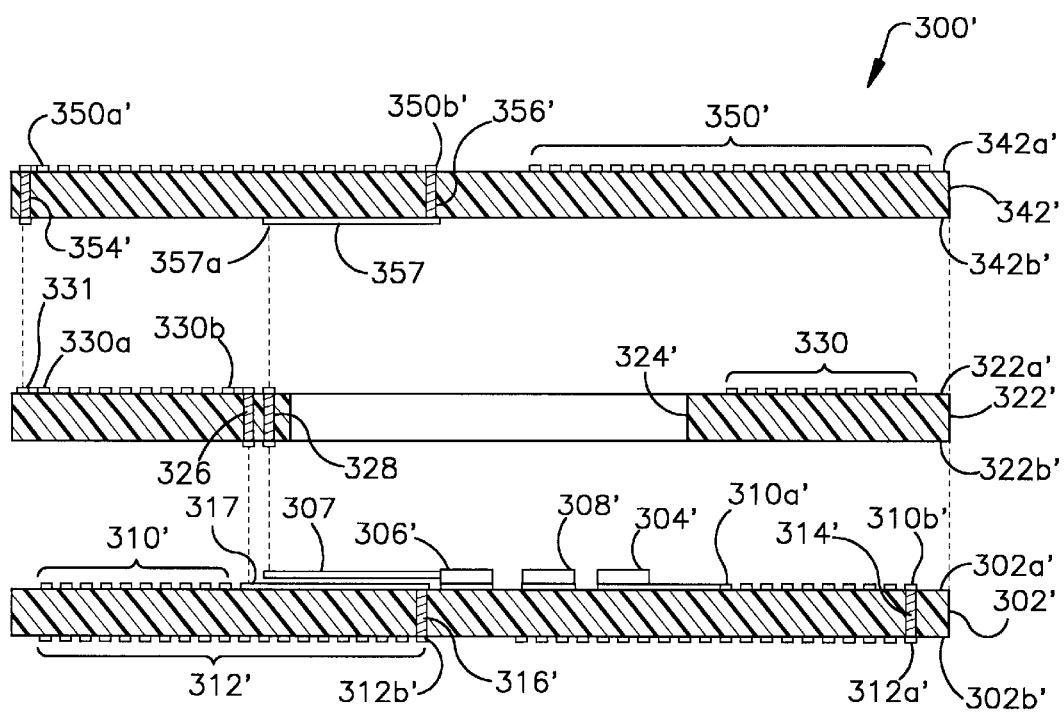
Figure 4:
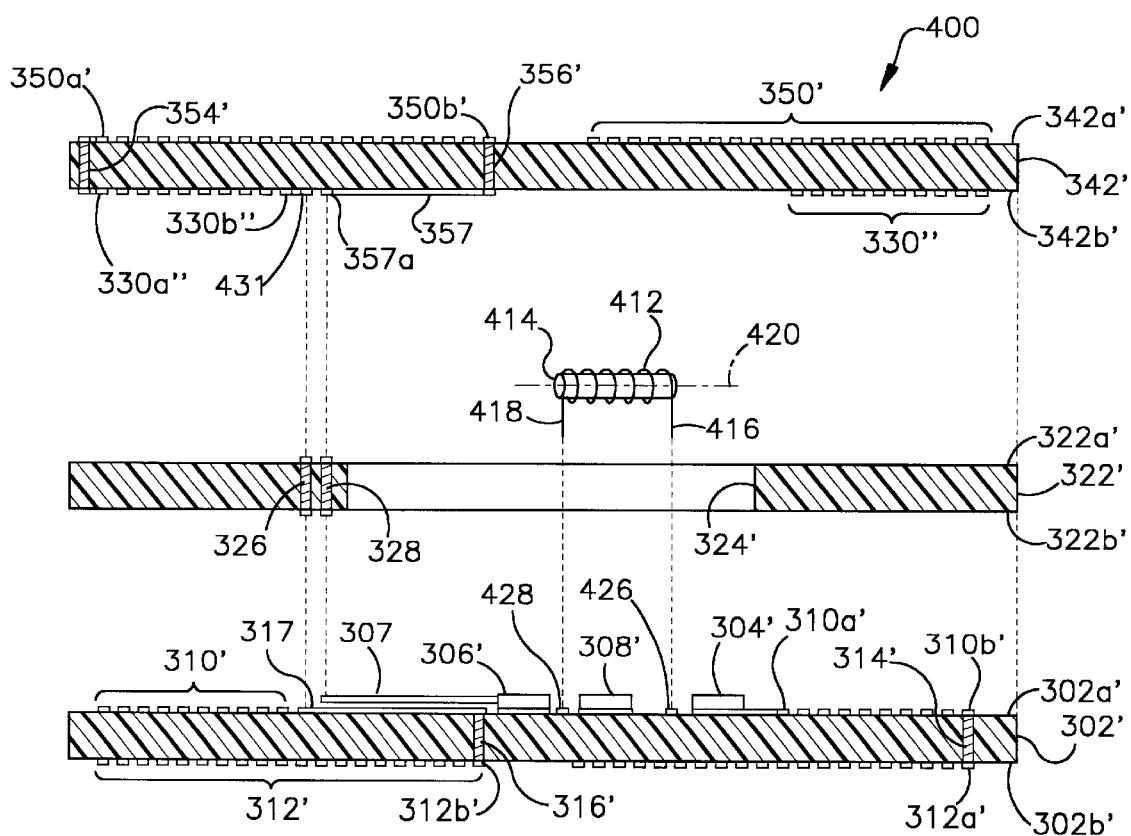
Figure 5A:
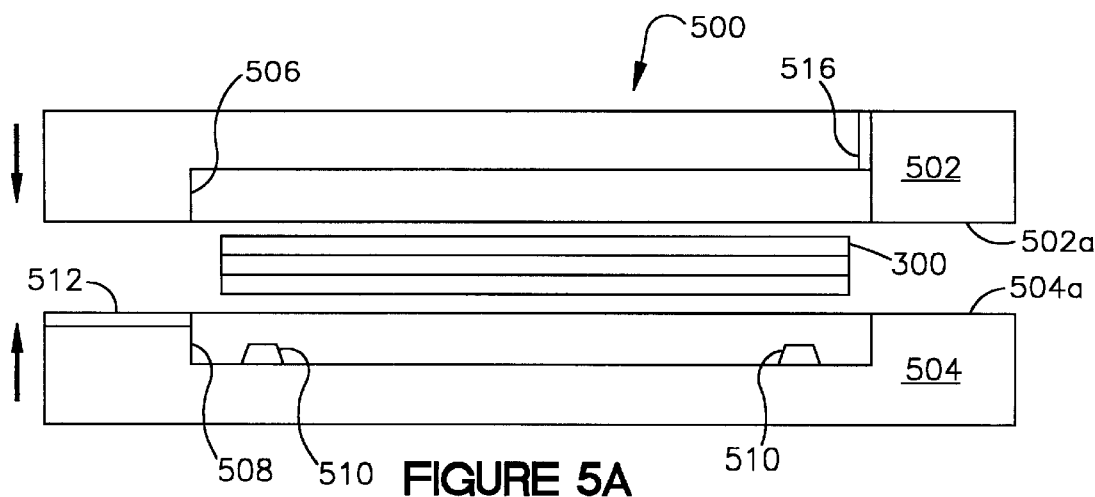
Figure 5B:
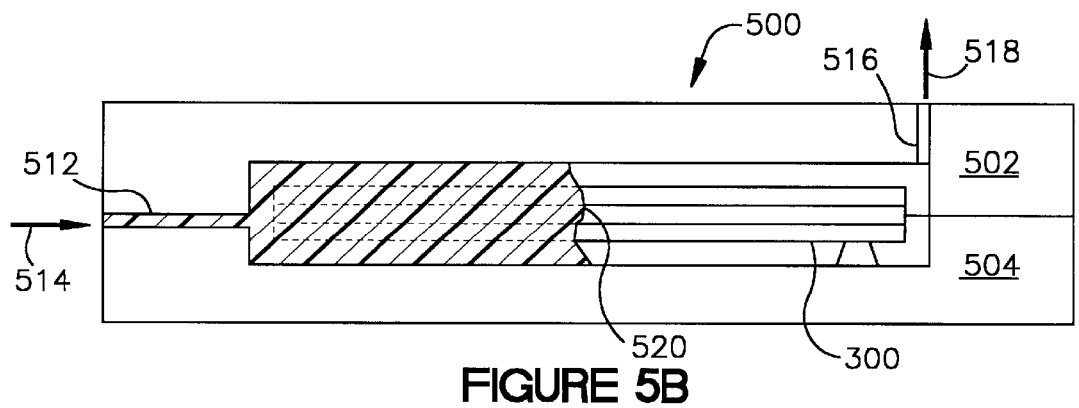
Figure 5C:
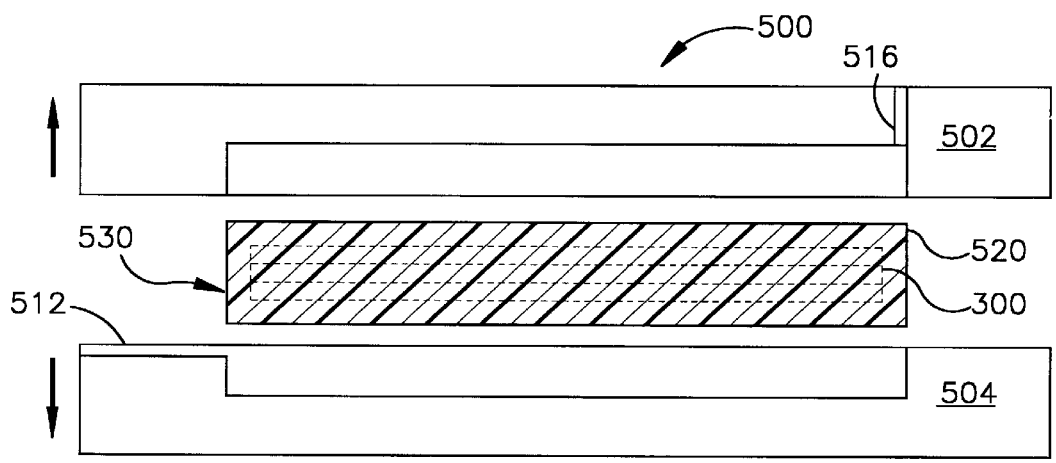

The structure, operation, and advantages of the present preferred embodiment of the invention will become further apparent upon consideration of the following description taken in conjunction with the accompanying drawings, wherein:

FIG. 1 is a cross-sectional view of a circuit module comprising one PCB, according to the invention;

FIG. 1A is a top view of the circuit module of FIG. 1, according to the invention;

FIG. 2 is an exploded, cross-sectional view of a circuit module comprising two PCBs, according to the invention;

FIG. 2A is an exploded, cross-sectional view of a circuit module comprising two PCBs, according to the invention, connected to an antenna;

FIG. 3 is an exploded, cross-sectional view of a circuit module comprising three PCBs, according to the invention;

FIG. 3A is an exploded, cross-sectional view of another circuit module comprising three PCBs, according to the invention;

FIG. 4 is an exploded, cross-sectional view of another circuit module comprising three PCBs, according to the invention, connected to a ferrite rod antenna;

FIG. 5A is an exploded, cross-sectional view of an injection molding process for encapsulating a circuit module, according to the invention;

FIG. 5B is a cross-sectional view of a further step in the injection molding process for encapsulating a circuit module, according to the invention; and FIG. 5C is an exploded, cross-sectional view of a further step in the injection molding process for encapsulating a circuit module, according to the invention.

DETAILED DESCRIPTION OF THE INVENTION

FIGS. 1 (side cross-sectional view) and 1A (top view) illustrate a circuit module 100 comprising a printed circuit board (PCB) 102 having conductive traces on both its top surface 102a and its bottom surface 102b, and electronic components 104, 106 and 108 mounted to its top surface 102a and interconnected with one another.

A long conductive trace 110 is in the form of a spiral having a one end 110a and another end 110b, and is disposed around a peripheral area of the top surface 102a of the PCB 102. In the views of FIGS. 1 and 1A, TEN complete turns can be seen.

In a similar manner, a one long conductive trace 112 is in the form of a spiral having a one end 112a and another end 112b, and is disposed on the bottom surface 102b of the PCB 102. In the cross-sectional view of FIG. 1, TWENTY turns can be seen.

The conductive traces 110 and 112 are connected in series with one another, and each of the conductive traces 110 and 112 forms a portion of an overall coil antenna for the circuit module 100. For example, the component 104 is connected to the end 110a of the trace 110. The end 110b of the trace 110 is connected by a via 114 through the PCB 102 to the end 112a of the trace 112. The end 112b of the trace 112 is connected by a via 116 through the PCB 102 to the component 106.

The conductive traces 110 and 112, and those discussed hereinbelow, are in the form of loops having many turns. These loops can be characterized as a planar coil which lays flat on the surface of the respective PCB in a form such as a spiral. As is known for coil antennas, the direction of current flow around the coil determines the direction of the radiated magnetic field, and vice-versa for a receiving antenna. Therefore, for the example hereinabove wherein traces 110 and 112 are connected in series to form at least part of an overall coil antenna, the spirals for the two traces 110 and 112 must be laid out so that the current flows in the same direction in the trace 110 and in the trace 112 portion of the antenna. For example, if the trace 110 spirals from end 110a to end 110b in a clockwise direction (looking down at the top PCB surface 102a), then the trace 112 must also spiral in the same clockwise direction from end 112a to end 112b.

It is within the scope of this invention that an overall coil antenna may be formed by connecting coils such as trace 110 and trace 112 in parallel with each other. This may be desirable in cases where, for example, very fine-pitched traces 110 and 112 are used, producing high electrical resistance in each coil. For a parallel connection, ends 110a and 112b would be connected together and to one antenna end connection such as component 106, and ends 110b and 112a would be connected together and to the other antenna end connection such as component 104. Such a parallel connection is not illustrated in FIG. 1, but can be seen in the parallel-connected traces 350 and 352 of FIG. 3. Known techniques could be employed to connect component 104 to trace end 110b (e.g., extending an insulated wire between the two, preferably crossing the turns of trace 110 at right angles, as illustrated for wire 227 of FIG. 2 which crosses the turns of trace 230). Now, in order to maintain proper current direction in a parallel-connected antenna formed from traces 110 and 112, if the trace 110 spirals from end 110a to end 110b in a clockwise direction (looking down at the top PCB surface 102a), then the trace 112 must also spiral in the same clockwise direction from end 112b to end 112a.

For a transmitting loop, the driving point voltage and current is proportional to radiation resistance (Rr) of the loop and is given by the following equation (eqn 1):

$$Rr=[6/(Mo/Eo)]^2(2L)^4(NA)^2$$

where:

$(Mo/Eo)^{-2}$ is the wave impedance of the space $2/L$ is the propagation constant in the space N is the number of turns in the loop A is the area of the loop For a receiving loop, the voltage (Vr) developed at its open-circuited terminals is given by the following equation (eqn 2):

$$Vr=jwNAB_z$$

where:

j is the square root of minus 1;

w is angular frequency (2f);

N is the number of turns in the loop;

A is the area of the loop; and $B_z$ is the component of incident magnetic density normal to the plane of the loop.

As can be seen by the expressions above, whether the conductive traces 110, 112 serve as a transmitting loop or a receiving loop, the RF transmission and receiving strength is directly related to the number of turns and the area circumscribed by the turns.

FIG. 2 illustrates a circuit module 200 comprising two printed circuit boards (PCBs) 202 and 222. The PCB 202 (compare 102) has conductive traces on both its top surface 202a and its bottom surface 202b, and electronic components 204, 206 and 208 mounted to its top surface 202a and interconnected with one another.

A one long conductive trace 210 (compare 110) is in the form of a spiral having a one end 210a and another end 210b, and is disposed around a peripheral area of the top surface 202a of the PCB 202. In the cross-sectional view of FIG. 2, TEN turns can be seen.

In a similar manner, a one long conductive trace 212 (compare 112) is in the form of a spiral having a one end 212a and another end 212b, and is disposed on the bottom surface 202b of the PCB 202. In the cross-sectional view of FIG. 2, TWENTY turns can be seen.

The PCB 222 is in the form of a ring, having a central opening 224, and has a top surface 222a and a bottom surface 222b. A one long conductive trace 230 (compare 210) is in the form of a spiral having a one end 230a and another end 230b, and is disposed around a peripheral area of the top surface 222a of the PCB 222. In the cross-sectional view of FIG. 2, TEN turns can be seen.

The conductive traces 210, 212 and 230 may be connected in parallel (not shown) or in series with one another (as illustrated) so that each forms a portion of a single overall coil antenna for the circuit module 200. For example, the component 204 is connected to the end 210a of the trace 210. The end 210b of the trace 210 is connected by a via 214 through the PCB 202 to the end 212a of the trace 212. The end 212b of the trace 212 is connected by a via 216 through the PCB 202 to a surface trace 217 which contacts a via 226 through the PCB 222 to the end 230a of the trace 230. The end 230b of the trace 230 is connected by a wire 227 to via 228 through the PCB 222 to connect with a surface trace 207 and thereby to the component 206. For clarity of illustration, the trace 207 is shown as if it were raised above trace 217, whereas in reality the traces 207 and 217 would usually be of equivalent height and separated horizontally, such as trace 207 being behind trace 217 in the view of FIG. 2. The wire 227 is suitably insulated from the spiral turns of trace 230 and preferably crosses the turns at right angles. Suitable insulation includes, for example, an air gap, enamel or PVC coating on the wire 227, an/or an insulating coating over the PCB 222 surface 222a and over the trace 230.

One having ordinary skill in the art to which the invention most nearly pertains will understand how, in this and other embodiments of the invention presented herein, connections are made between PCBs (from one PCB to another), using pins, connectors and the like. Generally, in this and other embodiments of the invention presented herein, when PCBs are stacked one atop the other, they preferably have approximately the same outside dimensions. In other words, they are preferably the same size and shape as one another.

Alternatively to the embodiment illustrated in FIG. 2, FIG. 2A illustrates the circuit module 200', having conductive traces 210' and 212' (compare 110 and 112) on the lower PCB 202' (compare 102) which may be series-connected with one another and connected to the electronic components 204' and 206', respectively, in the manner described for the circuit module 100, to form a winding of an air-gap transformer ("air-gap" is commonly understood to include non-conductive, non-magnetic materials such as the PCB material filling the transformer gap), with the conductive trace 230' on the upper PCB 222' not being connected to the traces 210' and 212' but rather serving as the other winding of the air-gap transformer. Such a transformer can serve as a coupling transformer which is connected to an antenna 260 for the circuit module. The ends 230a' and 230b' of the conductive trace 230' are shown connected to the antenna 260. The circuit module 200' is suitably an RF transponder, and the antenna 260 is suitably a coil of wire disposed circumferentially (360-degrees) around an inner surface of a pneumatic tire (not shown).

The lower PCB 202' has an upper surface 202a' and a lower surface 202b'. The upper PCB 222' has an upper surface 222a' and a lower surface 222b', and a central opening 224'. The trace 210' has two ends 210a' and 210b', and the trace 212' has two ends 212a' and 212b'.

FIG. 3 illustrates a circuit module 300 comprising three circuit boards (PCBs) 302, 322 and 342.

The lower PCB 302 (compare 102) has conductive traces on both its top surface 302a and its bottom surface 302b, and electronic components 304, 306 and 308 mounted to its top surface 302a and interconnected with one another.

A one long conductive trace 310 (compare 110) is in the form of a spiral having a one end 310a and another end 310b, and is disposed around a peripheral area of the top surface 302a of the PCB 302. In the cross-sectional view of FIG. 3, TEN turns can be seen.

In a similar manner, a one long conductive trace 312 (compare 112) is in the form of a spiral having a one end 312a and another end 312b, and is disposed on the bottom surface 302b of the PCB 302. In the cross-sectional view of FIG. 3, TWENTY turns can be seen.

In this example, the conductive traces 310 and 312 are connected in series with one another, and each form a portion of a transformer winding for the circuit module 300. For example, the component 304 is connected to the end 310a of the trace 310. The end 310b of the trace 310 is connected by a via 314 through the PCB 302 to the end 312a of the trace 312. The end 312b of the trace 312 is connected by a via 316 through the PCB 302 to the component 306.

The middle PCB 322 is in the form of a ring, having a central opening 324, and has a top surface 322a and a bottom surface 322b. In this example, the PCB functions primarily as a spacer, having no electrical functionality associated therewith. (Compare the ring-like PCB 222 which has conductive traces on a surface thereof).

The top PCB 342 has an upper surface 342a and a lower surface 342b, and is disposed atop the PCB 322 so as to cover the opening 324 in the middle of the PCB 322.

A one long conductive trace 350 (compare 112, 110) is in the form of a spiral having a one end 350a and another end 350b, and is disposed on the top surface 342b of the PCB 342. In the cross-sectional view of FIG. 3, TWENTY turns can be seen.

In a similar manner, a one long conductive trace 352 (compare 112) is in the form of a spiral having a one end 352a and another end 352b, and is disposed on the bottom surface 342b of the PCB 342. In the cross-sectional view of FIG. 3, TWENTY turns can be seen.

In this example, the conductive traces 350 and 352 are connected in parallel with one another, and each form a portion of a transformer winding for the circuit module 300. For example, an antenna 360 (compare 260) is connected to the end 350a of the trace 350 and also to the end 352b of the trace 352 by way of a via 356 (compare 316) through the PCB 342. The other end of the antenna 360 is connected to the end 350b of the trace 350 and also to the end 352a of the trace 352 by way of a via 354 (compare 314) through the PCB 342. In this manner, an air-gap transformer is formed, one winding comprising the series-connected traces 310 and 312, the other winding comprising the parallel-connected traces 350 and 352. The circuit module 300 is suitably an RF transponder, and the antenna 360 is suitably a coil of wire disposed circumferentially (360-degrees) around an inner surface of a pneumatic tire (not shown).

FIG. 3A illustrates a circuit module 300' comprising three printed circuit boards (PCBs) 302', 322' and 342'.

The lower PCB 302' (compare 202) has conductive traces on both its top surface 302a' and its bottom surface 302b', and electronic components 304', 306' and 308' mounted to its top surface 302a' and interconnected with one another.

A one long conductive trace 310' (compare 210) is in the form of a spiral having a one end 310a' and another end 310b', and is disposed around a peripheral area of the top surface 302a' of the PCB 302'. In the cross-sectional view of FIG. 3A, TEN turns can be seen.

In a similar manner, a one long conductive trace 312' (compare 212) is in the form of a spiral having a one end 312a' and another end 312b', and is disposed on the bottom surface 302b' of the PCB 302'. In the cross-sectional view of FIG. 3A, TWENTY turns can be seen.

The middle PCB 322' (compare 222) is in the form of a ring, having a central opening 324', and has a top surface 322a' and a bottom surface 322b'. A one long conductive trace 330 (compare 230) is in the form of a spiral having a one end 330a and another end 330b, and is disposed around a peripheral area of the top surface 322a' of the PCB 322'. In the cross-sectional view of FIG. 3A, TEN turns can be seen. The end 330a is connected to a contact pad 331, and the end 330b is connected to a via 326. A second via 328 passes through the PCB 322' somewhere near the edge of the central opening 324' and does not make electrical contact with any part of the trace 330.

The top PCB 342' has an upper surface 342a' and a lower surface 342b', and is disposed atop the PCB 322' so as to cover the opening 324' in the middle PCB 322'.

A one long conductive trace 350' (compare 350) is in the form of a spiral having a one end 350a' and another end 350b', and is disposed on the top surface 342a' of the PCB 342'. In the cross-sectional view of FIG. 3A, TWENTY turns can be seen.

The conductive traces 310', 312', 330, and 350' may be connected in parallel (not shown) or in series with one another (as illustrated) so that each forms a portion of a single overall coil antenna for the circuit module 300'. For example, the component 304' is connected to the end 310a' of the trace 310'. The end 310b' of the trace 310 is connected by a via 314' through the PCB 302' to the end 312a' of the trace 312'. The end 312b' of the trace 312' is connected by a via 316' (compare 216) through the PCB 302' to a surface trace 317 which contacts the via 326 (compare 226) through the PCB 322' to the end 330b of the trace 330. The end 330a of the trace 330 is connected to a contact 331 which connects to a via 354' through the PCB 342' to the end 350a' of the trace 350'. The end 350b' of the trace 350' is connected by a via 356' through the PCB 342' to a surface trace 357 with an end 357a which is placed to connect with via 328 through the PCB 322' to connect with a surface trace 307 and thereby to the component 306. For clarity of illustration, the trace 307 is shown as if it were raised above trace 317, whereas in reality the traces 307 and 317 would usually be of equivalent height and separated horizontally, such as trace 307 being behind trace 317 in the view of FIG. 3A.

It is within the scope of this invention that any or all of the circuit boards in the module 300' have long (elongate) conductive traces on one or both of their surfaces, and that these elongate conductive traces may be in the form of spirals, including square spirals, and that the conductive traces may be connected with one another in any manner, such as in series or in parallel with one another, or such as some functioning as a one winding of a coupling transformer and the others acting as the other winding of a coupling transformer, however a particular application for the circuit module may dictate.

The circuit modules 300 and 300' of FIGS. 3 and 3A, respectively, each have three PCBs stacked one atop the other. In both cases, the middle PCB 322, 322' is in the form of a ring, having a central opening 324, 324', respectively. As is evident from the illustrations, the top PCB 342, 342' covers the opening 324, 324', respectively. The opening 324, 324' thus forms a cavity wherein the components 304, 306, 308 (and 304', 306', 308') are contained within the assembly of three PCBs. With the exception that it is not covered, the opening 224, 224' in the PCB 222, 222' of the circuit module 200, 200' shown in FIGS. 2 and 2A also forms a cavity for containing the electronic components 204, 206, 208, 204', 206', 208' mounted to the lower PCB 202, 202'. These openings 224, 224', 324, 324' are suitably disposed in the center of the respective PCBs 222, 222', 322, 322', but it is within the scope of the invention that the openings 224, 224', 324, 324' are disposed other than at the center of the respective PCBs 222, 222', 322, 322'.

Coils, whether they be antenna coils or transformer windings, formed by the elongate traces (110, 112, 210, 210', 212, 212', 230, 230', 310, 310', 312, 312', 330, 350, 350') on the PCBs (102, 202, 202', 222, 222', 302, 302', 322, 322', 342, 342') have an axis which is normal to the surface of the PCB on which they are disposed. As viewed in the figures, the axis would be vertical on the sheet. Also, as described hereinabove, the spiraling direction of each of these coils formed by the elongate traces 110, 112, 210, 210', 212, 212', 230, 230', 310, 310', 312, 312', 330, 350, 350' is suitably determined in order to maintain parallel, same-direction current in adjacent connected coils, taking into account whether the coils are connected in series or in parallel.

With particular regard to elongate traces forming an antenna for the respective circuit module, it is within the scope of the invention that an additional antenna or transformer element may be included in the circuit module.

FIG. 4 illustrates a circuit module 400 which is substantially identical to the previously-described circuit module 300' of FIG. 3A. Where features of FIG. 4 are identical to corresponding features in FIG. 3A, the reference numbers for those features will be the same in the two figures. Features which have been added in FIG. 4 have reference signs in the 400 series, and modified features have a reference number which is the same as in FIG. 3A except for a double prime.

FIG. 4 illustrates an alternative embodiment of the coil placement, wherein the coil formed from trace 330" (compare 330) is placed on the bottom surface 342b' of the top PCB 342' so that the middle PCB 322' has no traces on it and serves mainly as an insulator/spacer between the bottom PCB 302' and the top PCB 342'. The vias 326 and 328 remain in the middle PCB 322' in order to carry current between the bottom PCB 302' and the top PCB 342'. The via 326 is now only connected to the end 330b" of the trace 330" by way of contact pad 431 when the PCBs are assembled together, and the end 330a" of the trace 330" is now fixedly connected to the via 354', thereby eliminating the contact pad 331.

A ferrite rod antenna 410 comprising a coil of wire 412 wound about a generally-cylindrical ferrite rod 414 is disposed within the cavity formed by the opening 324'. The rod 414 is oriented so that its axis 420 (hence the axis of the coil of wire 412) is parallel to the surface 302a' of the PCB 302'. The coil of wire 412 has two ends 416 and 418 which are connected to respective terminals 426 and 428 on the PCB 302'. The ferrite rod antenna 410 may be used in lieu of the antenna coils formed by the elongate traces 310', 312', 330", 350' on the PCBs 302', 322', 342', but preferably is used in conjunction with the antenna coils formed by the elongate traces 310', 312', 330", 350'.

It is within the scope of the invention that the wire 412 is replaced by conductive traces on the surfaces 302a' and 342b' of the lower and upper PCBs 302' and 342', respectively, and, optionally, conductive traces on the sidewall(s) of the cavity formed by the opening 324' in the middle PCB 322'. This can be structured with or without the ferrite rod.

As mentioned above, the coils formed by the elongate traces 310', 312', 330", 350' on the PCBs 302', 322', 342' have an axis which is normal to the surfaces of the PCBs on which they are disposed. Therefore, the axis 420 of the ferrite rod antenna 410 is orthogonal to the axis of the antenna coils formed by spiral elongate traces 310', 312', 330", 350' on the PCBs. In this manner, using the ferrite rod antenna 410 in conjunction with the antenna coil(s) formed by the elongate traces 310', 312', 330", 350', an omni-directional (or, dual-polarized or directional) antenna system is provided for the transponder.

Various benefits will accrue when using such an omni-directional or dualdirectional antenna system in a circuit module (400) serving as an RF transponder disposed within a pneumatic tire. Preferably, the transponder (circuit module 400) would be mounted within the tire so that the axis 420 of the ferrite rod antenna 410 extends axially (from bead-to-bead) across the tread of the tire, i.e., is parallel to the axis of the tire.

Commonly-owned U.S. Pat. No. 5,181,975 and U.S. Pat. No. 5,218,861, incorporated in their entirety by reference herein, disclose improving coupling to a tire-mounted transponder by utilizing an annular bead of the tire as the primary winding of a transformer. A transponder is disposed near the annular bead, and has a coil antenna that is loosely electromagnetically coupled to the annular bead, and acts as the secondary winding of the transformer.

Despite the "360-degree" readability of a transponder which can result from using an annular bead or the like in the tire as a coupling element, it is suspected that coupling from a transponder in a rotating tire, via an annular bead or the like, to an externally fixed antenna can result in non-uniform coupling, including phase shifts. It is, of course, generally desirable to ensure uniform, or at least adequate, coupling of RF signals between an on-board interrogator and a tire-mounted transponder, irrespective of the orientation of the wheel vis-a-vis the vehicle-mounted antenna. By using the omni-directional antenna system of the present invention in a circuit module (400) serving as an RF transponder disposed within a pneumatic tire, as described hereinabove, coupling can be enhanced and rendered more uniform.

ENCAPSULATING THE CIRCUIT MODULE

U.S. Pat. No. 5,420,757 (Eberhardt, et al.; 1995), incorporated in its entirety by reference herein, discloses a method of producing a RF transponder with a molded environmentally sealed package. The components are mounted on a lead-type substrate frame, and are encapsulated in a plastic housing using a conventional plastic molding process utilizing a suitable plastic or epoxy (column 6, lines 56–62). The leads which support the transponder in the mold during the molding process are eventually severed to provide a leadless package. As disclosed in the patent, the frame may be a PCB formed to have supporting arms which are severed at the periphery of the respective plastic molded housings.

Injection molding is a well-known process. Typically, a two-part mold of an injection molding machine has a cavity which is in the shape of the desired final product. Molten or fluid material is injected into the cavity via gates to fill the cavity, and encapsulate any object which was previously inserted into the cavity.

FIGS. 5A, 5B and 5C illustrate an injection molding process for encapsulating any of the circuit modules described hereinabove—for example, the circuit module 300.

FIG. 5A shows a mold 500 while open. The mold 500 comprises two mold halves, an upper mold half 502 and a lower mold half 504. An inner surface 502a of the upper mold half 502 has a recess 506. An inner surface 504a of the lower mold half 504 has a recess 508. When the mold halves 502 and 504 are brought together, as indicated by the arrows in FIG. 5A, the recesses 506 and 508 form a cavity. The circuit module 300 is disposed in any suitable manner, such as supported by pins or posts 510, within the cavity.

FIG. 5A shows the mold 500 when closed. The circuit module 300 is smaller than the cavity, there being spaces between the circuit module and the walls of the cavity.

The lower mold half 504 is provided with a gate 512 for injecting molding material into the mold cavity, as indicated by the arrow 514. The upper mold half 502 is provided with a vent hole 516 for venting gas (e.g., air) from the mold cavity, as indicated by the arrow 518. This is best viewed in FIG. 5B which shows the mold cavity partially (approximately half, e.g., the left half as viewed in the figure) filled with molding material 520, and the circuit module 300 partially encapsulated. Once the cavity is filled, the molding material is molded to shape and allowed to solidify, by cooling or curing to a desired degree prior to removal from the mold. Heat can be applied to the mold if necessary (depending on the material used).

FIG. 5C shows the mold 500 opened up upon completion of the molding process. At the completion of the molding process, the circuit module 300 is fully and completely encapsulated with molding material 520, and the mold halves 502 and 504 are separated, as indicated by the arrows in FIG. 5C, resulting in the encapsulated circuit module 530 illustrated in FIG. 5C which has molding material on all of its external (exposed) surfaces.

Suitable molding materials for encapsulating the circuit module include rubber selected from the group consisting of essentially ethylene propylene diene monomer (EPDM) rubber, butyl rubber, natural rubber, synthetic rubbers, neoprene and mixtures thereof, such as, for example, a mixture of halobutyl rubber and natural rubber, poul-butadiene rubber and natural rubber or a mixture of styrene-butadiene rubber (SBR) and natural rubber. These rubber compositions can typically be cured by heating to a desired temperature in the order of 150 degrees (C) and for a period of time depending upon the curing system used, accelerators, and the degree of curing desired prior to removal of the product from the mold.

While the invention has been described in combination with embodiments thereof, it is evident that many alternatives, modifications, and variations will be apparent to those skilled in the art in light of the foregoing description. Accordingly, it is intended to embrace all such alternatives, modifications and variations as fall within the spirit and scope of the appended claims.

What is claimed is:

1. A circuit module comprising:

a first printed circuit board having electronic components on a first surface thereof, having a first conductive trace in the form of a loop having many turns disposed on the first surface thereof, and having a second conductive trace in the form of a loop having many turns disposed on a second surface thereof, wherein the second conductive trace is connected to the first conductive trace; and to selected ones of the electronic components; and a second printed circuit board in the form of a ring, disposed on the first surface of the first printed circuit board and having an opening for containing the electronic components;

wherein the first and second conductive traces are laid out so that current flows in the same direction in both traces.

2. Circuit module, according to claim 1, wherein:

the first and second conductive traces are connected in series with one another.

3. Circuit module, according to claim 1, wherein:

the first and second conductive traces are connected in parallel with one another.

4. Circuit module, according to claim 1, wherein:

the first and second conductive traces are in the form of spirals.

5. Circuit module, according to claim 1, further comprising:

a third conductive trace disposed on a surface of the second printed circuit board, wherein the third conductive trace is connected to the first conductive trace.

6. Circuit module, according to claim 5, wherein:

the third conductive trace is in the form of a spiral.

7. Circuit module, according to claim 5, further comprising:

a third printed circuit board having a fourth conductive trace on a surface thereof, wherein the fourth conductive trace is connected to the third conductive trace.

8. Circuit module, according to claim 7, wherein:

the fourth conductive trace is in the form of a spiral.

9. Circuit module, according to claim 1, further comprising:

an antenna; and a third conductive trace disposed on a surface of the second printed circuit board;

wherein:

the third conductive trace is connected to the antenna; and the first and second conductive traces constitute a first winding of an air-gap transformer; and the third conductive trace constitutes a second winding of the air-gap transformer.

10. Circuit module, according to claim 1, wherein:

the circuit module is an RF transponder.

11. Circuit module, according to claim 10, further comprising an antenna is disposed circumferentially around an inner surface of a pneumatic tire.

12. Circuit module, according to claim 1, further comprising:

a molding material disposed on external surfaces of the circuit module;

wherein the molding material is selected from the group consisting of essentially Ethylene Propylene Diene Monomer rubber, butyl rubber, synthetic rubber, natural rubber, neoprene and mixtures thereof.

* * * * *